US011592553B2

(12) United States Patent
Qiu et al.

(10) Patent No.: US 11,592,553 B2
(45) Date of Patent: Feb. 28, 2023

(54) DISTANCE MEASUREMENT SYSTEM AND METHOD USING LIDAR WAVEFORM MATCHING

(71) Applicant: Suteng Innovation Technology Co., LTD, Shenzhen (CN)

(72) Inventors: Chunxin Qiu, Shenzhen (CN); Letian Liu, Shenzhen (CN)

(73) Assignee: SUTENG INNOVATION TECHNOLOGY CO., LTD, Shenzhen (CN)

( * ) Notice: Subject to any disclaimer, the term of this patent is extended or adjusted under 35 U.S.C. 154(b) by 1014 days.

(21) Appl. No.: 16/095,321

(22) PCT Filed: Apr. 22, 2016

(86) PCT No.: PCT/CN2016/081765
§ 371 (c)(1),
(2) Date: Oct. 19, 2018

(87) PCT Pub. No.: WO2017/181453
PCT Pub. Date: Oct. 26, 2017

(65) Prior Publication Data
US 2019/0129031 A1    May 2, 2019

(30) Foreign Application Priority Data

Apr. 20, 2016 (CN) .......................... 201610250795.0

(51) Int. Cl.
*G01S 17/08* (2006.01)
*G01S 7/484* (2006.01)
(Continued)

(52) U.S. Cl.
CPC .............. *G01S 17/08* (2013.01); *G01S 7/484* (2013.01); *G01S 7/487* (2013.01); *H03M 1/12* (2013.01)

(58) Field of Classification Search
CPC .......... G01S 7/484; G01S 17/08; G01S 7/487; H03M 1/12
(Continued)

(56) References Cited

U.S. PATENT DOCUMENTS 10,790,631 B2 *  9/2020  Chang ................... H01S 3/0057
2002/0167655 A1  11/2002  Friedman et al.
(Continued)

FOREIGN PATENT DOCUMENTS

CN         1851499 A    10/2006
CN      101029934 A     9/2007
(Continued)

OTHER PUBLICATIONS

European Patent Office, Extended European Search Report for European Application No. 16899040.6 dated Oct. 24, 2019.
(Continued)

*Primary Examiner* — Daniel L Murphy
(74) *Attorney, Agent, or Firm* — Rimon PC

(57) ABSTRACT

Provided are a pulse laser ranging system and method employing a time domain waveform matching technique. The system comprises a software part and a hardware part. The hardware part comprises an optical collimation system, an FPGA, a filter, a photoelectric conversion system, an analog amplifier circuit, a laser transmitter, a signal combination system, an ADC sampling system and a narrow pulse laser transmitting circuit. When transmitting a control signal to control laser transmission, the FPGA sends a time reference pulse to the signal combination system. The signal combination system integrates the time reference pulse with a fixed amplitude analog echo signal to form an echo signal with a time reference. The echo signal with a time reference is quantified into a digital detection signal in the ADC sampling system. The digital detection signal is sent to the
(Continued)

FPGA to undergo data analysis. The software part is used to perform time domain waveform matching analysis to obtain a ranging result. The ranging result is output by the FPGA.

6 Claims, 1 Drawing Sheet

(51) Int. Cl.
  *G01S 7/487* (2006.01)
  *H03M 1/12* (2006.01)
(58) Field of Classification Search
  USPC ......................................................... 356/5.01
  See application file for complete search history.

(56) References Cited

U.S. PATENT DOCUMENTS

| | | |
|---|---|---|
| 2008/0010822 A1 | 1/2008 | Tsai et al. |
| 2008/0100822 A1 | 5/2008 | Munro |
| 2010/0020306 A1 | 1/2010 | Hall |
| 2013/0258312 A1 | 10/2013 | Lewis |

FOREIGN PATENT DOCUMENTS

| | | |
|---|---|---|
| CN | 101839981 A | 9/2010 |
| CN | 102621556 A | 8/2012 |
| CN | 102680980 A | 9/2012 |
| CN | 103235314 A | 8/2013 |
| CN | 103364790 A | 10/2013 |
| CN | 103926590 A | 7/2014 |
| CN | 104035097 A | 9/2014 |
| CN | 103576134 B | 10/2015 |
| CN | 105157566 B | 12/2015 |
| CN | 105319556 A | 2/2016 |
| CN | 105705964 A | 6/2016 |
| CN | 105785381 A | 7/2016 |
| CN | 105824029 A | 8/2016 |
| CN | 103983340 B | 6/2017 |
| CN | 206362927 U | 7/2017 |
| CN | 107153193 A | 9/2017 |
| EP | 0665446 A2 | 8/1995 |
| JP | 2010091855 A | 4/2010 |

OTHER PUBLICATIONS

International Search Report for PCT/CN2016/081765.
Written Opinion for PCT/CN2016/081765.
International Search Report dated Jan. 16, 2018 in the patent application PCT/CN2017/106697. 13 pages.

* cited by examiner

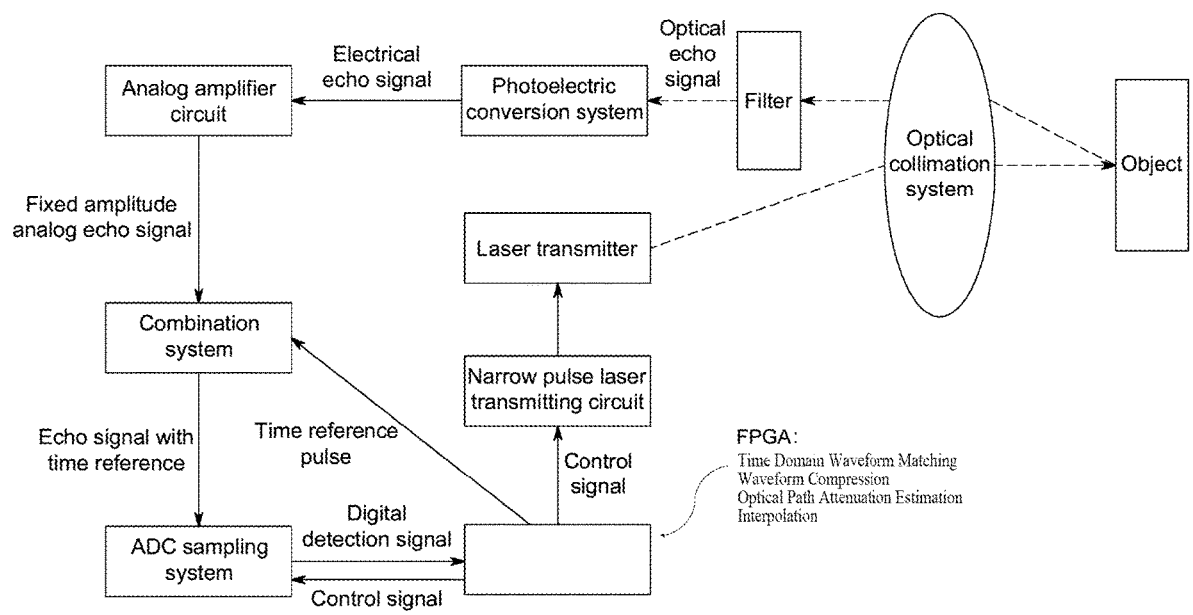

DISTANCE MEASUREMENT SYSTEM AND METHOD USING LIDAR WAVEFORM MATCHING

RELATED APPLICATIONS

The present application is a US national phase application of and claims priority to PCT application PCT/CN2016/081765 filed on Apr. 22, 2016 and titled Laser Ranging System and Method Employing Time Domain Waveform Matching Technique, the content of which is incorporated herein in its entirety.

TECHNICAL FIELD

The present invention relates to the technical field of measurement instruments, in particular to a pulse laser ranging system and method.

BACKGROUND

The basic principle of pulse laser ranging is actively transmitting pulsed laser onto a target, then detecting a laser echo signal of a radiated point on the target, measuring the TOF (time of flight) of the pulsed laser and then obtaining the distance from the target to a ranging device. The ranging accuracy of the pulse laser ranging depends on the measurement accuracy of the laser TOF. As the pulsed laser is affected by the diffusion characteristics of the target and the atmosphere, laser echo signal varies greatly in amplitude and waveform, and a time drift error caused thereby brings difficulties to accurate determination of the laser echo time. Nowadays, there are four main laser echo time discrimination methods, namely: a leading edge discrimination method, a constant fraction discrimination method, a CR-high-pass discrimination method, and an error compensation method. The leading edge discrimination method employs a single fixed threshold value to determine the stopping time of the laser echo signal. Although its circuit is simple, the time drift error cannot be overcome. Both the constant fraction discrimination method and the CR-high-pass discrimination method can effectively eliminate the time drift error. The constant fraction discrimination method takes the time when the leading edge of the laser echo signal reaches a half-maximum point as the stopping time of the laser echo signal. The CR-high-pass discrimination method uses the differential effect of a high-pass capacitance-resistance filter circuit to convert an extreme point of the laser echo signal into a zero point, and takes the zero point as the stopping time of the laser echo signal. However, these two methods are complicated in circuit structure and are difficult to implement. The error compensation method employs a plurality of different fixed threshold values to measure the same laser echo signal, uses a determined error compensation curve to compensate for the time drift error caused by a single fixed threshold value and obtain the accurate stopping time of the laser echo signal. Although this method is simple in circuit structure and is easy to implement, determination of the error compensation curve and fitting of the error compensation curve or establishment of an error compensation table have to be carried out in advance, this increases the complexity of the pulse laser ranging method.

The inventor found that the patent document 1 (CN 103364790 A) also provides a pulse laser ranging system and method employing time domain waveform matching analysis. However, the technical solution of this document has the problem that a triggering threshold of the system varies along with the amplitude of the echo signal, which results in a relatively large fluctuation of the triggering time.

SUMMARY

The objective of the present invention is to provide a laser ranging system and method employing a time domain waveform matching technique, effectively solving the problem that the triggering threshold of a TDC (time digital converter) system varies along with the amplitude of the echo signal and results in a relatively large fluctuation of the triggering time, and also solving the test rate problem of a low-and-medium frequency phase type ranging method.

To achieve the above objective, the present invention provides a pulse laser ranging system employing a time domain waveform matching technique. The system includes a software part and a hardware part; the hardware part includes an optical collimation system, an FPGA, a filter, a photoelectric conversion system, an analog amplifier circuit, a laser transmitter, a signal combination system, an ADC sampling system and a narrow pulse laser transmitting circuit; the FPGA transmits a control signal to the narrow pulse laser transmitting circuit, the transmitting circuit controls the laser transmitter to transmit pulsed laser; the laser is transmitted onto an object through the optical collimation system, and is reflected by the object so that the optical echo signal is transmitted to the photoelectric conversion system through the optical collimation system and the filter; the photoelectric conversion system converts the optical echo signal into an electric echo signal, the electric echo signal is converted into a fixed amplitude analog echo signal through the analog amplifier circuit, then the fixed amplitude analog echo signal enters the signal combination system; when transmitting a control signal to control the laser transmission, the FPGA sends a time reference pulse to the signal combination system; the signal combination system integrates the time reference pulse with the fixed amplitude analog echo signal to form an echo signal with a time reference; the echo signal with a time reference is converted into a digital detection signal in the ADC sampling system; the digital detection signal is sent to the FPGA to undergo data analysis; and a ranging result is obtained through time domain waveform matching analysis and output by the FPGA. The software part includes a time domain waveform matching analysis algorithm, a waveform compression algorithm, optical path attenuation estimation and an interpolation algorithm.

Preferably, the software part also includes a high-speed analog-to-digital converter combination algorithm; the high-speed analog-to-digital converter combination algorithm is used to measure the time interval of the echo signal at a high speed and with high precision, thus increasing the laser ranging test frequency per second.

Preferably, the filter is a narrow-band filter.

Based on the above-mentioned system, the present invention also provides a pulse laser ranging method employing a time domain waveform matching technique, including the following steps:

step 1, controlling charging of a transmitting array by a transmitting control part;

step 2, transmitting laser in an optical channel, diffusing the laser back to an optical receiving part, and performing photoelectric conversion by a photoelectric conversion system;

step 3, amplifying the weak echo signal by a preamplifier by an N factor, and adding it to a time reference pulse by a combination system;

step 4, an ADC sampling the echo signal and performing simple screening on a huge amount of data, and preliminarily finding peak values so as to select a useful part via screening, so as to reduce subsequent computation load, where estimation on echo power is also completed here, the calculated power value of the echo signal is sent to a transmission control module, a transmission control system is designed in such a way that a charging circuit which has been operating in a zero state ensures that the transmission powers of two transmissions are completely independent of each other, and that any transmission power within the rated range can be selected for any one transmission;

step 5, performing time domain waveform analysis, where the analysis includes a time domain waveform matching algorithm and optical path attenuation estimation, a relatively high time resolution is obtained through interpolation, and the time resolution is finer than 50 ps;

step 6, since AGC has different group delays under the circumstance of different gains, it is difficult for the response speed to be fast, in order to ensure accuracy and to facilitate adjusting of the speed, a variable gain process is refrained from using, instead, an expert control system is used to adjust the transmission power according to the optical path attenuation so that optical path attenuation is compensated and the energy of the next echo signal falls within an expected power range, thereby obtaining an echo signal with a better signal-to-noise ratio, and the relative value of the transmission power is given here;

step 7, deriving the reflectivity of the object being ranged according to the transmission power, the ranged distance and the expert system to deduce a gray-scale value.

Preferably, the method also includes step 8: transmitting packaged information including "distance, gray-scale value, polar coordinates, transmission power, echo intensity, and verification" from a rotary component to a host computer via a customized magnetic coupling link.

Preferably, the typical value of N is 1000.

The present invention has the following beneficial effects: The present invention carries out interpolation and finds the peak value according to the waveform profile characteristic of the echo signal, effectively overcoming the problem that the triggering threshold of a TDC (time digital converter)—based system varies along with the amplitude of the echo signal and results in a relatively large fluctuation of the triggering time, and also solving the test rate problem of a low-and-medium frequency phase type ranging method.

At present, according to the 1 ns time interval data sequence acquired by ADC sampling, when the signal-to-noise ratio of the echo signal is better than 15 dB, a time resolution finer than 50 ps can be obtained. In addition, a 256-scale gray-scale diagram can be provided by the test result in the typical environment, and a good visual effect can be achieved when data are recovered at a PC.

BRIEF DESCRIPTION OF THE DRAWINGS

FIG. 1 is a structural block diagram of a laser ranging system employing a time domain waveform matching technique of the present invention.

DETAILED DESCRIPTION

The present invention is described in further detail in conjunction with the accompanied drawings and the specific embodiments.

FIG. 1 is a structural block diagram of a laser ranging system employing a time domain waveform matching technique of the present invention. The system includes a software part and a hardware part.

The hardware part includes an optical collimation system, an FPGA, a filter, an photoelectric conversion system, an analog amplifier circuit, a laser transmitter, a signal combination system, an ADC sampling system and a narrow pulse laser transmitting circuit; the FPGA transmits a control signal to the narrow pulse laser transmitting circuit, the transmitting circuit controls the laser transmitter to transmit pulsed laser; the laser is transmitted onto an object through the optical collimation system, and is reflected by the object so that the optical echo signal is transmitted to the photoelectric conversion system through the optical collimation system and the filter; the photoelectric conversion system converts the optical echo signal into an electric echo signal, the electric echo signal is converted into a fixed amplitude analog echo signal through the analog amplifier circuit, then the fixed amplitude analog echo signal enters the signal combination system; when transmitting a control signal to control the laser transmission, the FPGA sends a time reference pulse to the signal combination system; the signal combination system integrates the time reference pulse with the fixed amplitude analog echo signal to form an echo signal with a time reference; the echo signal with a time reference is converted into a digital detection signal in the ADC sampling system; the digital detection signal is sent to the FPGA to undergo data analysis; a ranging result is obtained through time domain waveform matching analysis and output by the FPGA. The software part includes a time domain waveform matching analysis algorithm, optical path attenuation estimation and an interpolation algorithm; the software part also includes a high-speed analog-to-digital converter combination algorithm; the high-speed analog-to-digital converter combination algorithm is used to measure the time interval of the echo signal at a high speed and with high precision, thus increasing the laser ranging test frequency per second.

Using the above-mentioned system, the present invention provides a pulse laser ranging method employing a time domain waveform matching technique, including the following steps:

step 1, controlling charging of a transmitting array by a transmitting control part;

step 2, transmitting laser in an optical channel, diffusing the laser back to an optical receiving part, and performing photoelectric conversion by a photoelectric conversion system;

step 3, amplifying the weak echo signal by a preamplifier by an N (typical value of N) factor, and adding it to a time reference pulse by a combination system;

step 4, an ADC sampling the echo signal and performing simple screening on a huge amount of data, and preliminarily finding peak values so as to select a useful part via screening, so as to reduce subsequent computation load, where estimation on echo power is also completed here, the calculated power value of the echo signal is sent to a transmission control module, a transmission control system is designed in such a way that a charging circuit which has been operating in a zero state ensures that the transmission powers of two transmissions are completely independent of each other, and that any transmission power within the rated range can be selected for any one transmission;

step 5, performing time domain waveform analysis, where the analysis includes a time domain waveform matching algorithm and optical path attenuation estimation, a relatively high time resolution is obtained through interpolation, and the time resolution is finer than 50 ps;

step 6, since AGC (Automatic Gain Control System) has different group delays under the circumstance of different gains, it is difficult for the response speed to be fast, in order to ensure accuracy and to facilitate adjusting of the speed, a variable gain process is refrained from using. Instead, an expert control system is used to adjust the transmission power according to the optical path attenuation so that optical path attenuation is compensated and the energy of the next echo signal falls within an expected power range, thereby obtaining an echo signal with a better signal-to-noise ratio, and the relative value of the transmission power is given here;

step 7, deriving the reflectivity of the object being ranged according to the transmission power, the ranged distance and the expert system to deduce a gray-scale value;

step 8: transmitting packaged information including "distance, gray-scale value, polar coordinates, transmission power, echo intensity, and verification" from a rotary component to a host computer via a customized magnetic coupling link.

The above-mentioned contents are detailed description of the present invention in conjunction with the specific embodiments, and it cannot be deemed that the specific embodiments of the present invention are limited to these descriptions. For those ordinarily skilled in the art, various simple modifications or replacements that can be made without departing from of the spirit of the present invention shall all fall within the protection scope of the present invention.

What is claimed is:

1. A pulse laser ranging system employing a time domain waveform matching technique
    comprising a software part and a hardware part;
    wherein the hardware part comprises: an optical collimation system, an FPGA, a filter, a photoelectric conversion system, an analog amplifier circuit, a laser transmitter, a signal combination system, an ADC sampling system, and a narrow pulse laser transmitting circuit; and the software part comprises a time domain waveform matching analysis algorithm, a waveform compression algorithm, optical path attenuation estimation or an interpolation algorithm;
    wherein the FPGA is configured to transmit a control signal to the narrow pulse laser transmitting circuit;
    wherein the narrow pulse laser transmitting circuit is configured to control the laser transmitter to transmit pulse laser in response to the control signal, the laser is transmitted onto an object through the optical collimation system, and is reflected by the object so that an optical echo signal is transmitted to the photoelectric conversion system through the optical collimation system and the filter;
    wherein the photoelectric conversion system is configured to convert the optical echo signal into an electric echo signal, the analog amplifier circuit is configured to convert the electric echo signal into a fixed amplitude analog echo signal through the analog amplifier circuit, and send the fixed amplitude analog echo signal to the signal combination system;
    wherein, when transmitting a control signal to control the laser transmission, the FPGA is configured to send a time reference pulse to the signal combination system, the signal combination system is configured to integrate the time reference pulse with the fixed amplitude analog echo signal to form an echo signal with a time reference; and
    wherein the ADC sampling system is configured to convert the echo signal with a time reference into a digital detection signal and send the digital detection signal to the FPGA to undergo data analysis; and the FPGA is further configured to obtain and output a ranging result obtained through time domain waveform matching analysis.

2. The system of claim 1, wherein the software part also comprises a high-speed analog-to-digital converter combination algorithm; the high-speed analog-to-digital converter combination algorithm is used to measure a time interval of the echo signal.

3. The system of claim 1, wherein the filter is a narrow-band filter.

4. A pulse laser ranging method employing a time domain waveform matching technique, applied to the system according to any one of claims 1-3, the method comprising the following steps:
    step 1, controlling, by a transmitting control part, to charge a transmitting array, wherein the transmission control part is configured as a charging circuit operating in a zero state, which ensures that transmission powers for two transmissions are independent of each other and that any transmission power within a predetermined range can be selected for any transmission;
    step 2, transmitting a pulse laser in an optical channel towards an object, receiving diffused pulse laser at an optical receiving part, and performing photoelectric conversion by a photoelectric conversion system;
    step 3, amplifying an echo signal by a preamplifier by an N factor, and adding the amplified echo signal to a time reference pulse by a combination system;
    step 4, sampling the amplified echo signal by an ADC sampling system, performing simple screening on an amount of data, and preliminarily finding peak values to select a part of the data so as to reduce subsequent computation load, calculating a power value of the amplified echo signal and sending the power value to a transmission control module;
    step 5, performing time domain waveform analysis, where the time domain waveform analysis comprises a time domain waveform matching algorithm and optical path attenuation estimation, and obtaining a time resolution finer than 50 ps through interpolation;
    step 6, using an expert control system to adjust the transmission power according to an optical path attenuation to compensate the optical path attenuation such that the power value of a next echo signal falls within an expected power range, thereby obtaining an echo signal with an improved signal-to-noise ratio; and
    step 7, deriving a reflectivity of the object being ranged according to the transmission power, a ranged distance and an expert system to deduce a gray-scale value.

5. The method of claim 4, wherein the method further comprises step 8:
    transmitting packaged information including "distance, gray-scale value, polar coordinates, transmission power, echo intensity, and verification" from a rotary component to a host computer via a customized magnetic coupling link.

6. The method of claim 4, wherein the value of N is 1000.

* * * * *